(12) United States Patent
Rubenstein et al.

(10) Patent No.: US 9,060,436 B2
(45) Date of Patent: Jun. 16, 2015

(54) LAND GRID ARRAY SOCKET ASSEMBLY

(75) Inventors: Brandon Rubenstein, Loveland, CO (US); Roger Nattkemper, Antelope, CA (US); Eric R. Daniel, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 58 days.

(21) Appl. No.: 13/822,702

(22) PCT Filed: Oct. 28, 2010

(86) PCT No.: PCT/US2010/054503
§ 371 (c)(1),
(2), (4) Date: Mar. 13, 2013

(87) PCT Pub. No.: WO2012/057767
PCT Pub. Date: May 3, 2012

(65) Prior Publication Data
US 2013/0208410 A1 Aug. 15, 2013

(51) Int. Cl.
*H01R 4/48* (2006.01)
*H05K 7/10* (2006.01)
*G06F 1/16* (2006.01)

(52) U.S. Cl.
CPC ............... *H05K 7/10* (2013.01); *H05K 7/1069* (2013.01); *G06F 1/16* (2013.01)

(58) Field of Classification Search
CPC .................................................. H01R 13/2442
USPC ............................................. 439/71, 83, 862
See application file for complete search history.

(56) References Cited

U.S. PATENT DOCUMENTS

| 3,290,636 | A | * | 12/1966 | Overtveld | 439/71 |
| 7,097,463 | B2 | | 8/2006 | Hsiao et al. | |
| 7,214,069 | B2 | * | 5/2007 | Rathburn | 439/66 |
| 7,607,952 | B2 | * | 10/2009 | Tai | 439/700 |
| 7,695,288 | B2 | | 4/2010 | Ma et al. | |
| 2004/0266227 | A1 | | 12/2004 | Ma | |
| 2005/0202696 | A1 | | 9/2005 | Hsiao et al. | |
| 2006/0040518 | A1 | | 2/2006 | Ma et al. | |
| 2007/0042615 | A1 | | 2/2007 | Liao | |

OTHER PUBLICATIONS

Korean Intellectual Property Office, Notification of Transmittal of the International Search Report and the Written Opinion of the International Searching Authority, or the Declaration for PCT/US2010/054503 dated Jul. 29, 2011 (9 pages).
The International Bureau of WIPO, Notification Concerning Transmittal of International Preliminary Report on Patentability (Chapter 1 of the Patent Cooperation Treaty) for PCT/US2010/054503 dated May 10, 2013 (6 pages).

* cited by examiner

*Primary Examiner* — Phuong Dinh
(74) *Attorney, Agent, or Firm* — Hewlett-Packard Patent Department

(57) ABSTRACT

A land grid array socket assembly comprises a plurality of cells, with each cell comprising an insulative body having a top surface, and contact conductor that has a first portion that extends from a board contact point up to and beyond the top surface to a contact bend, and a second portion that extends from the contact bend to terminate below the top surface and within the insulative body.

17 Claims, 6 Drawing Sheets

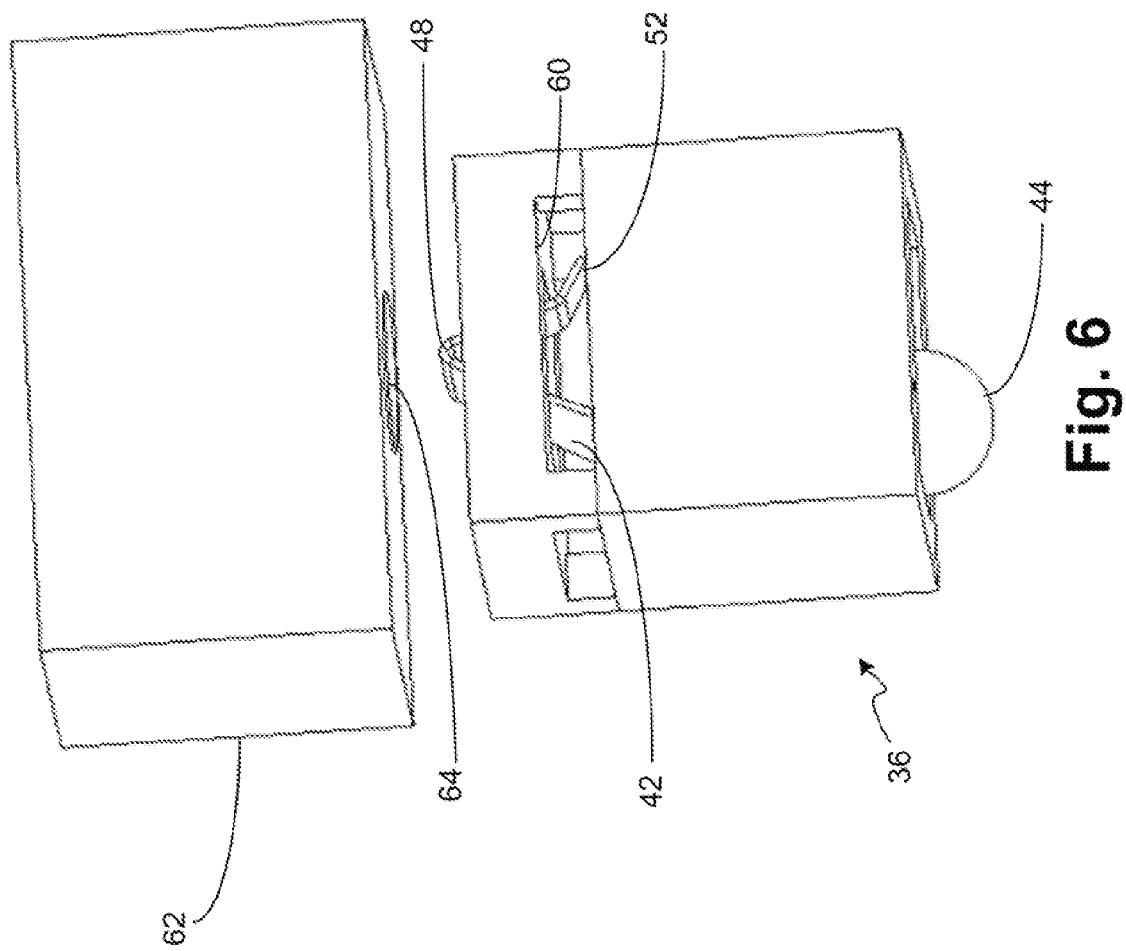

LAND GRID ARRAY SOCKET ASSEMBLY

BACKGROUND

In the art of computing, land grid arrays (LGAs) are used to couple a board to an integrated circuit (IC) via a socket assembly. Often the IC is a central processing unit (CPU).

An LGA differs from other grid arrays, such as a pin grid array (PGA) or ball grid array (BGA) in that the socket assembly typically has contact conductors that contact pads on the IC. Typically the IC is placed in the socket assembly, and a clamping mechanism urges the IC and socket assembly together, thereby causing the contact conductors of the socket assembly to be in electrical contact with the contact pads of the IC. Typically the LGA socket assembly is attached to a circuit board, with contact conductors of the socket assembly soldered to pads on the circuit board.

In one configuration known in the art, the contact conductors of the LGA socket assembly comprise cantilever beams housed in insulative cells. The cantilever beams are resilient, thereby accommodating vertical position variations from cell to cell. The cantilever beams terminate at exposed edges above a mating surface of the LGA socket assembly.

BRIEF DESCRIPTION OF THE DRAWINGS

The Figures depict embodiments, implementations, and configurations of the invention, and not the invention itself.

FIG. 6 shows a different view of the cell after assembly.

DETAILED DESCRIPTION

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the examples.

As described in the Background section above, one LGA socket assembly known in the art has cantilever beams that terminate at exposed edges above the mating surface of the LGA socket assembly. However, the exposed edges can easily catch on an object that is moved over the cantilever beams, thereby causing damage to the beams. The damage can lead to a need to repair the LGA socket assembly, and may even require replacing the entire board to which the LGA socket assembly is attached.

The examples disclosed herein address this issue by providing a contact conductor that has a first portion that extends up to and beyond a top surface of the LGA socket assembly to a contact bend, and a second portion that extends from the contact bend to terminate below the top surface. Accordingly, there are no exposed termination edges that can catch on objects moved over the contact conductors, thereby reducing potential to damage the LGA socket assembly, and reducing the possibly of having to replace the board to which the LGA socket assembly is attached.

Figure 1:
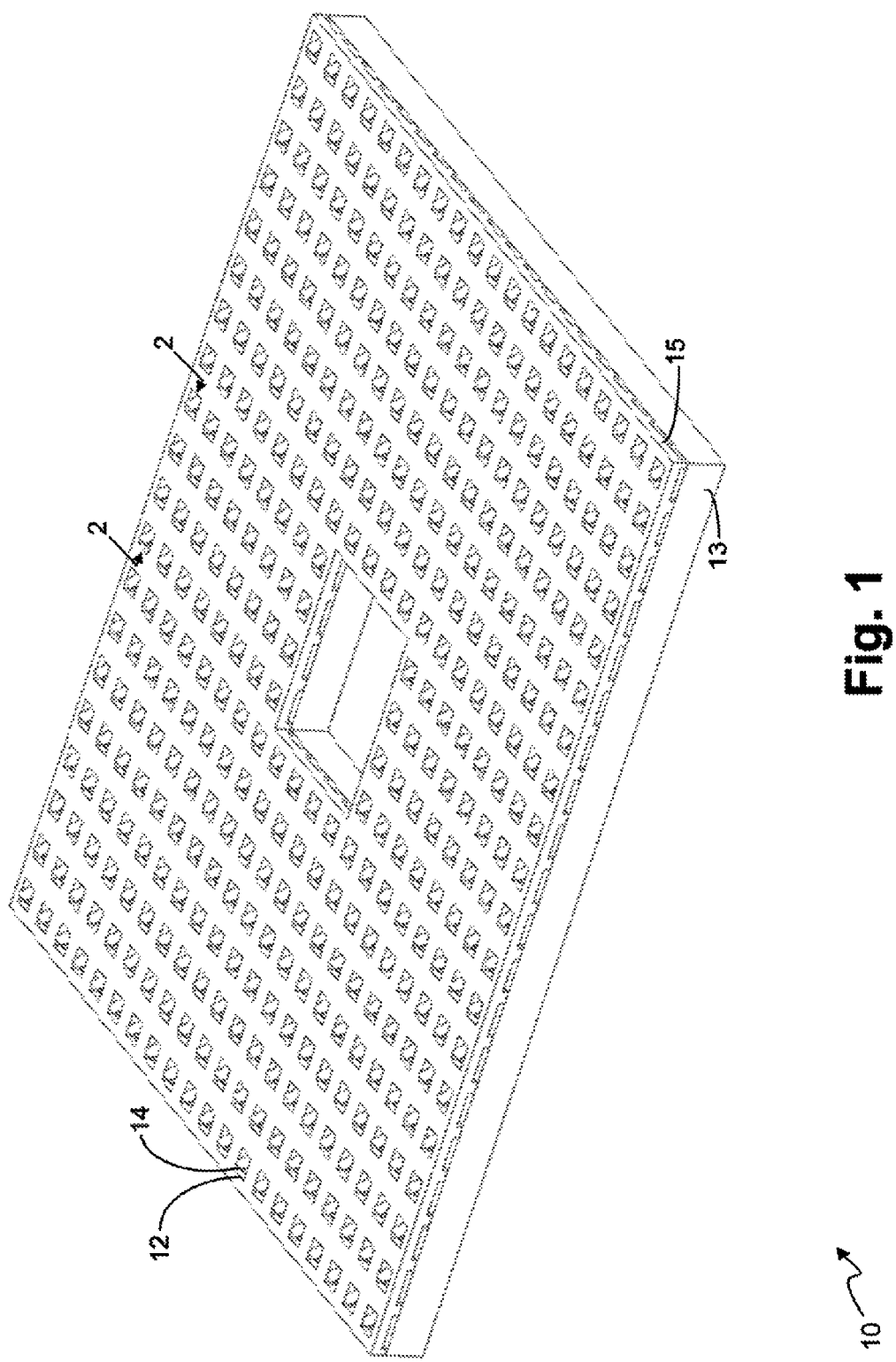
FIG. 1 shows an example of a land grid array (LGA) socket assembly.

FIG. 1 shows an example of an LGA socket assembly 10. Assembly 10 includes an array of cells having contact conductors, such as cell 12 and contact conductor 14. Note that assembly 10 includes a base portion 13 and a cap portion 15. As will be seen in greater detail in the figures discussed below, the contact conductors extend above a top surface of assembly 10 and have a termination edge below the top surface and between base portion 13 and cap portion 15.

Note that a typical LGA socket assembly will often have many more contact conductors than are shown in FIG. 1. For example, it is common for modern LGA socket assemblies to have more than 1000 contact conductors.

Figure 2:
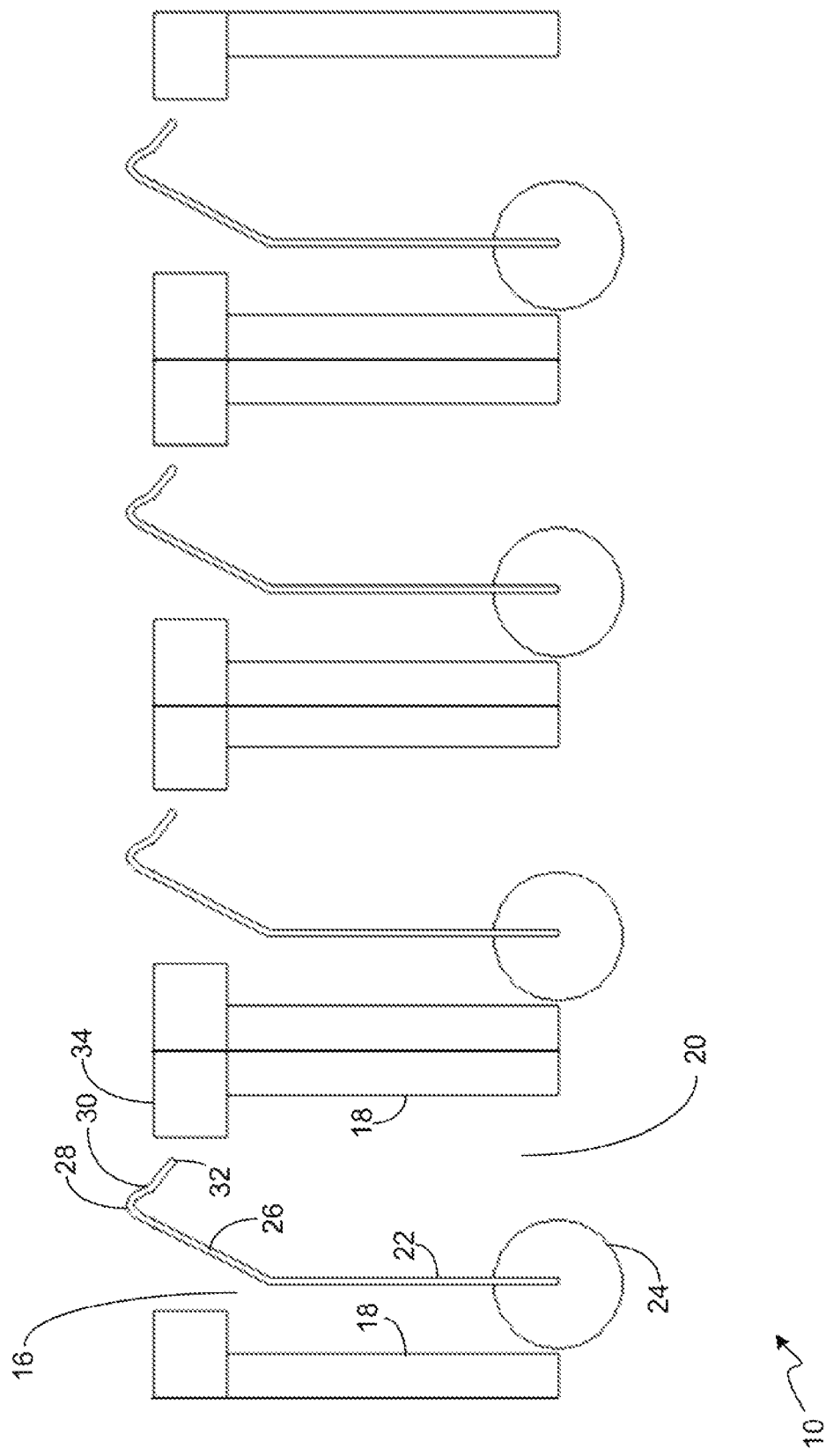
FIG. 2 is a sectional view of the LGA socket assembly taken along line 2-2 of FIG. 1 showing one example.

FIG. 2 is a sectional view of LGA socket assembly 10 taken along line 2-2 of FIG. 1 showing one example. FIG. 2 shows four cells. Using cell 16 as an example, cell 16 includes insulative body 18 with cavity 20 therein. Contact conductor 22 has solder ball 24 at one end for soldering contact conductor 22 to a solder pad of a board. Contact conductor 22 includes first portion 26 extending from solder ball 24 to contact bend 28, and second portion 30 that extends from contact bend 28 to below top surface 34 to terminate at end 32. Since end 32 is below top surface 34, contact conductor 22 is less likely to snag an object moving across top surface 34.

Figure 3:
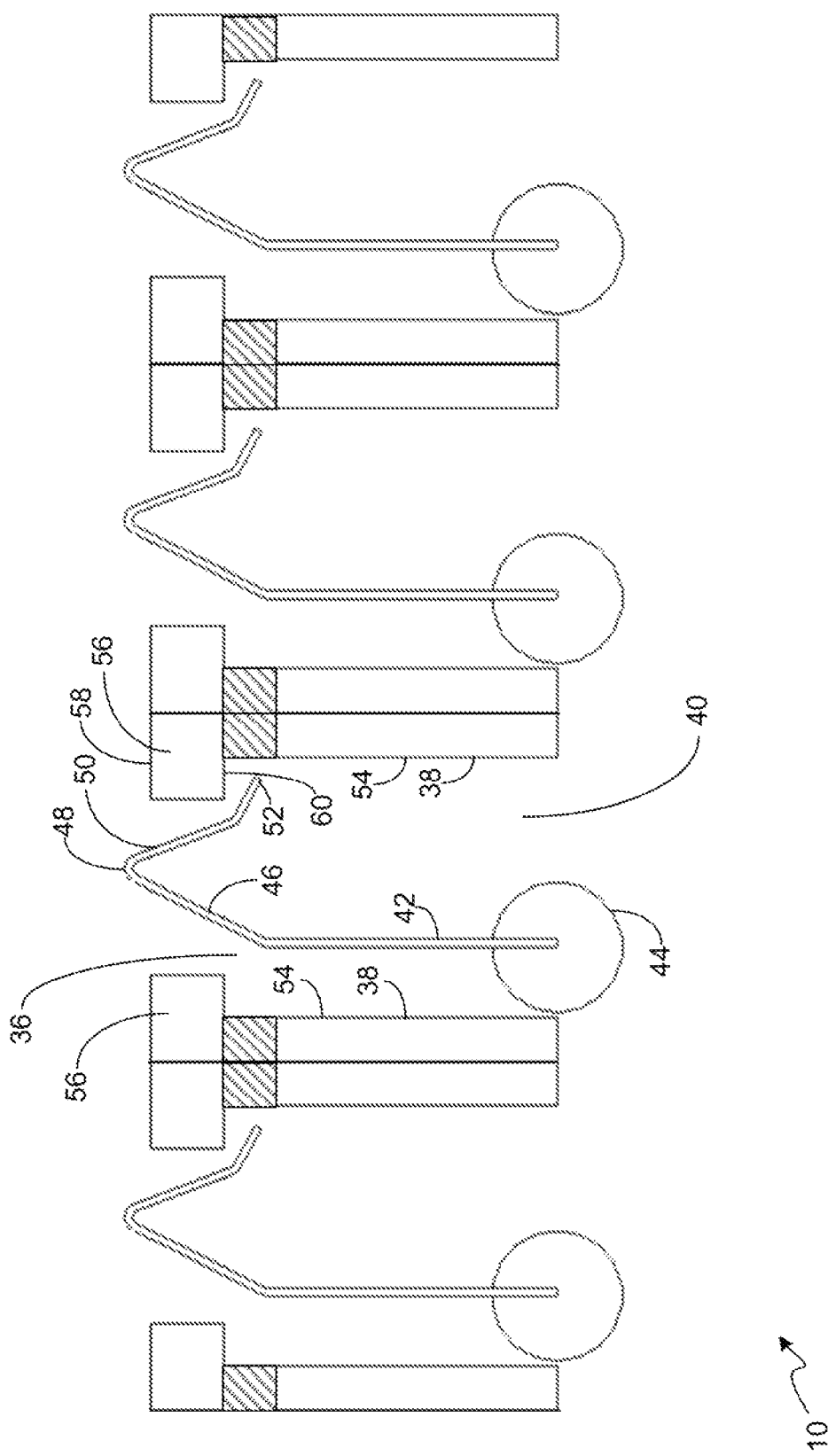
FIG. 3 is a sectional view of the LGA socket assembly taken along line 2-2 of FIG. 1 showing another example.

FIG. 3 is a sectional view of LGA socket assembly 10 taken along line 2-2 of FIG. 1 showing another example. FIG. 3 shows four cells. Using cell 36 as an example, cell 36 includes insulative body 38 with cavity 40 therein. Contact conductor 42 has solder ball 44 at one end for soldering contact conductor 42 to a solder pad of a board. Contact conductor 42 includes first portion 46 extending from solder ball 44 to contact bend 48, and second portion 50 that extends from contact bend 48 to terminate at end 52.

Note that insulative body 38 includes base portion 54 and cap portion 56. Cap portion 56 has a top surface 58 and bottom surface 60 that forms a retainment edge. The opening in cap portion 56 is cross-sectionally smaller than the area directly underneath the retainment edge. Note that the sections shown with cross-hatching represent support legs of cap portion 56, and are more clearly shown in FIGS. 4, 5, and 6. Since second portion 50 terminates at end 52 below the retainment edge formed by bottom surface 60, the example shown in FIG. 3 is more resistant to damage because even if an object moving over top surface 58 snags contact conductor 42, the retainment edge will tend to retain end 52 to prevent second portion 50 from being pulled out of cavity 40.

Figure 4:
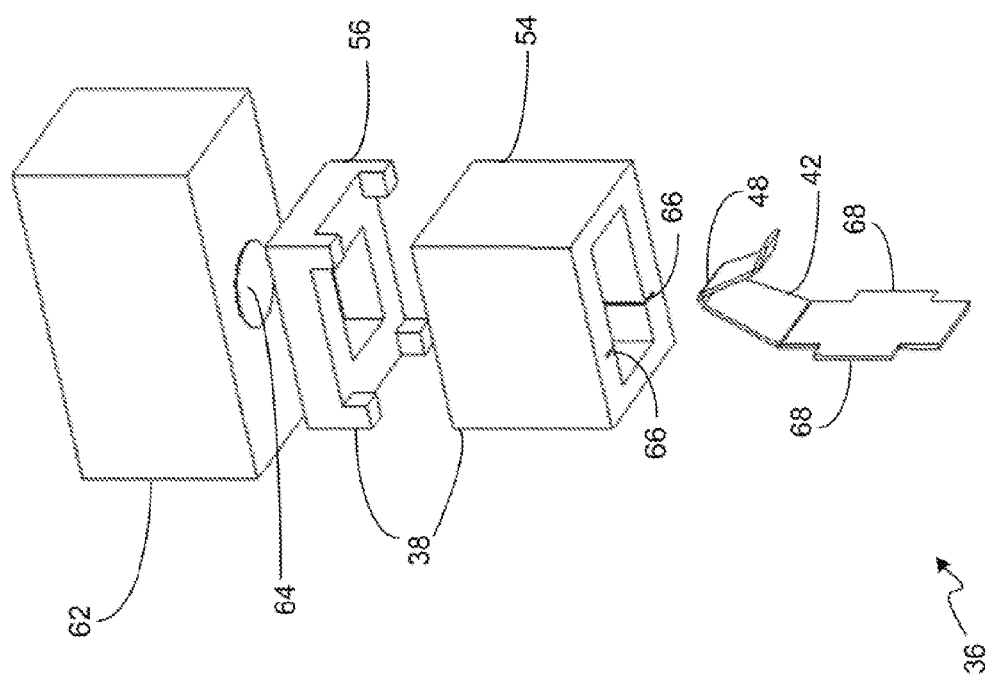
FIG. 4 is an exploded perspective view of a cell that is part of the sectional view of the LGA socket assembly shown in FIG. 3.

FIG. 4 is an exploded perspective view of cell 36 of FIG. 3 showing contact conductor 46, insulative body 38 (comprising base portion 54 and cap portion 56), and a portion of integrated circuit 62 having a contact pad 64 that contacts contact bend 48. Note that base portion 54 of insulative body 38 includes slots 66 to receive edges 68 of contact conductor 42. Contact conductor 42 may be made of any suitable material having appropriate conductive and resilient properties, such as copper plated with gold.

Figure 5:
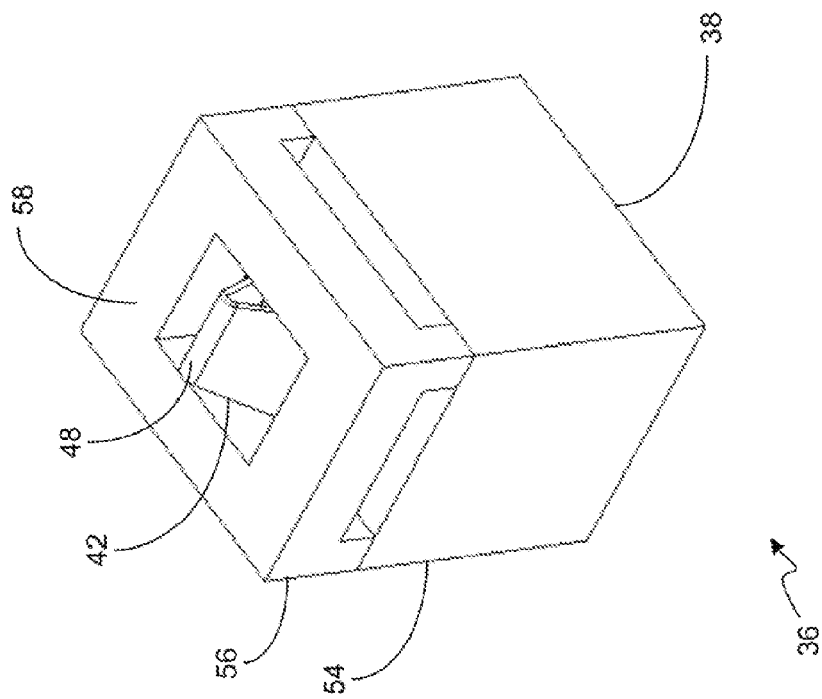
FIG. 5 shows the cell of FIG. 4 after assembly.

FIG. 5 shows cell 36 of FIG. 4 after assembly. Note that contact bend 48 of contact conductor 42 is above top surface 38 of cap portion 56 of insulative body 38.

FIG. 6 shows a different view of cell 36 after assembly, including solder ball 44 and integrated circuit 62 with contact pad 64 close to contacting contact bend 48.

Figure 7:
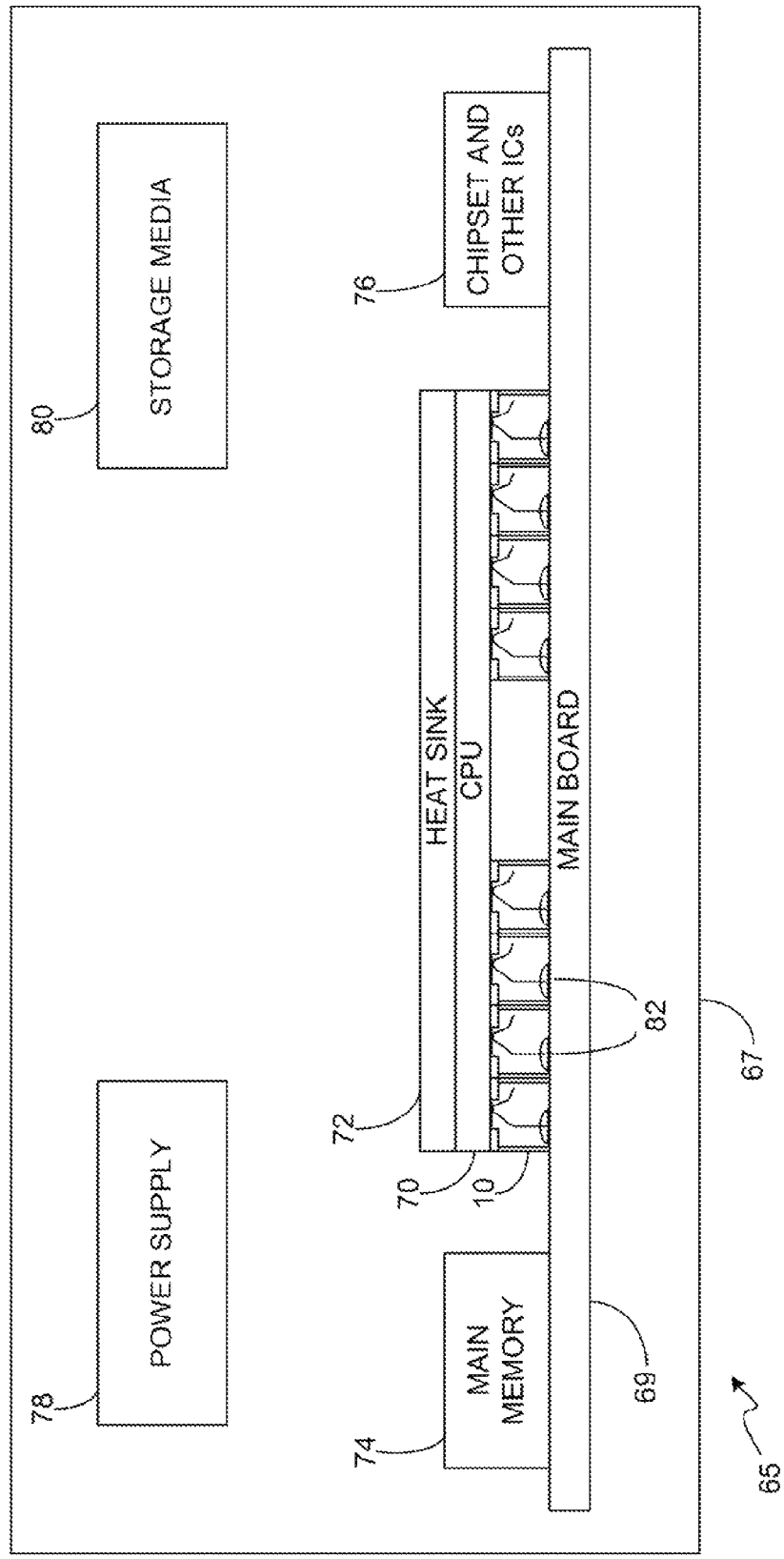
FIG. 7 shows a computer system. that uses the LGA. socket assembly of FIG. 1.

FIG. 7 shows a computer system 65 that uses LGA socket assembly 10. Computer system 65 includes enclosure 67, main board 69, LGA socket assembly 10, central processing unit (CPU) 70, heat sink 72, main memory 74, chipset and other ICs 76, power supply 78, and storage media 80. The solder balls of the cells of LGA socket assembly 10 are soldered to solder pads of main board 69, such as solder pads 82.

The examples disclosed above describe an LGA socket assembly for use with modern CPUs and other integrated circuits that is resistant to damage caused by objects moving over contact conductors. Accordingly, the examples reduce the need to service bent conductors, and possibly replace main boards, thereby lowering costs and increasing efficiency.

In the foregoing description, numerous details are set forth to provide an understanding of the examples disclosed herein. However, it will be understood by those skilled in the art that the examples may be practiced without these details. While a limited number of examples hare been disclosed, those skilled in the art will appreciate numerous modifications and variations therefrom. It is intended that the appended claims cover such modifications and variations as fall within the true spirit and scope of the disclosed examples.

What is claimed is:

1. A land grid array socket assembly, comprising:
   a plurality of cells, a cell of the plurality of cells comprising:
      an insulative body having a top surface, and a contact conductor that has a first portion that extends from a board contact point up to and beyond the top surface to a contact bend, and a second portion that extends from the contact bend to terminate below the top surface and within the insulative body, the insulative body including a base portion and a cap portion that is separate from the base portion, the cap portion including a lower surface providing a retainment edge, and the second portion terminating under the retainment edge.

2. The land grid array socket assembly of claim 1 comprising a solder ball at the board contact point.

3. The land grid array socket assembly of claim 2 wherein the insulative body includes slots, and the contact conductor includes edges that engage the slots.

4. The land grid array socket assembly of claim 1, wherein the cap portion includes an opening through which the contact conductor extends beyond the top surface.

5. The land grid array socket assembly of claim 4 wherein the cap portion includes legs to support the cap portion on the base portion, and wherein the lower surface of the cap portion is spaced apart from an upper surface of the base portion by the legs when the cap portion is in contact with the base portion.

6. The land grid array socket assembly of claim 5 wherein the cap portion is removable from the base portion.

7. A board assembly comprising:
   a board having board pads; and
   a land grid array socket assembly comprising a plurality of cells, each cell of the plurality of cells comprising:
      an insulative body having a top surface, and a contact conductor that has a first portion that extends from a board contact point in electrical contact with a board pad up to and above the top surface to a contact bend, and a second portion that extends from the contact bend to terminate below the top surface and within the insulative body, the insulative body including a base portion and a cap portion that is separate from the base portion, the cap portion including a lower surface providing a retainment edge, and the second portion terminating under the retainment edge.

8. The board assembly of claim 7 wherein the board contact points of the contact conductors of the cells are soldered to the board pads.

9. The board assembly of claim 7 wherein the insulative body includes slots, and the contact conductor includes edges that engage the slots.

10. The board assembly of claim 7, wherein the cap portion includes an opening through which the contact conductor extends beyond the top surface.

11. The board assembly of claim 10 wherein the cap portion includes legs to support the cap portion on the base portion, and wherein the lower surface of the cap portion is spaced apart from an upper surface of the base portion by the legs when the cap portion is in contact with the base portion.

12. The board assembly of claim 7 wherein the cap portion is removable from the base portion.

13. A computer system comprising:
   an enclosure;
   a main board within the enclosure, the main board having board pads;
   a land grid array socket assembly comprising a plurality of cells, each cell of the plurality of cells comprising:
      an insulative body having a top surface, and a contact conductor that has a first portion that extends from a board contact point in electrical contact with a board pad up to and beyond the top surface to a contact bend, and a second portion that extends from the contact bend to terminate below the top surface and within the insulative body, the insulative body including a base portion and a cap portion that is separate from the base portion, the cap portion including a lower surface providing a retainment edge, and the second portion terminating under the retainment edge; and
   a device having pads in electrical contact with the contact bends of the land grid array socket assembly.

14. The computer system of claim 13 wherein the board contact points of the contact conductors of the cells are soldered to the board pads.

15. The computer system of claim 13 wherein the insulative body includes slots, and the contact conductor includes edges that engage the slots.

16. The computer system of claim 13 wherein the cap portion is removable from the base portion.

17. The computer system of claim 16 wherein the cap portion includes legs to support the cap portion on the base portion, and wherein the lower surface of the cap portion is spaced apart from an upper surface of the base portion by the legs when the cap portion is in contact with the base portion.

* * * * *